(12) United States Patent
Lin et al.

(10) Patent No.: US 7,335,933 B2
(45) Date of Patent: Feb. 26, 2008

(54) DYNAMIC RANDOM ACCESS MEMORY CELL AND METHOD FOR FABRICATING THE SAME

(75) Inventors: Yung-Chang Lin, Taichung Hsien (TW); Chia-Wen Liang, Hsinchu (TW); Chuan-Fu Wang, Jhunan Township, Miaoli County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 10/718,896

(22) Filed: Nov. 20, 2003

(65) Prior Publication Data
US 2005/0106832 A1  May 19, 2005

(30) Foreign Application Priority Data
Nov. 13, 2003  (TW) ............................. 92131757 A

(51) Int. Cl.
*H01L 27/108* (2006.01)
(52) U.S. Cl. ...................... 257/296; 438/386
(58) Field of Classification Search ........ 438/238–239, 438/242–244, 386–387; 257/296, 301, 311, 257/E27.084, E21.651
See application file for complete search history.

(56) References Cited

U.S. PATENT DOCUMENTS

| 5,426,324 | A | * | 6/1995 | Rajeevakumar | 257/368 |
| 5,455,192 | A | * | 10/1995 | Jeon | 438/244 |
| 6,096,632 | A | * | 8/2000 | Drynan | 438/618 |

* cited by examiner

*Primary Examiner*—David Vu
(74) *Attorney, Agent, or Firm*—J.C. Patents

(57) ABSTRACT

A DRAM cell and a method for fabricating the same are provided. The method includes: forming a trench in a substrate; forming a first capacitor dielectric layer on the surface of the trench; forming a conducting layer inside the trench; forming a second capacitor dielectric layer on the surface of the substrate and on the conducting layer, wherein the substrate around the first and second capacitor dielectric layers serves as a bottom electrode; forming a protruding electrode on the substrate, the protruding electrode being on the substrate around the trench and covering a junction between the trench and the substrate; and electrically connecting the protruding electrode and the conducting layer, the conducting layer and the protruding electrode being an upper electrode.

23 Claims, 5 Drawing Sheets

DYNAMIC RANDOM ACCESS MEMORY CELL AND METHOD FOR FABRICATING THE SAME

CROSS-REFERENCE TO RELATED APPLICATION

This application claims the priority benefit of Taiwan application serial no. 92131757, filed on Nov. 13, 2003, the full disclosure of which is incorporated herein by reference.

BACKGROUND OF THE INVENTION

1. Field of the Invention

This invention generally relates to a method for fabricating a semiconductor device, and more particularly to a dynamic random access memory (DRAM) cell and a method fabricating the same.

2. Description of Related Art

Capacitor plays an important role in storing data in a memory cell. The more charges the capacitor stores, lesser the noise will affect the reading/writing process for a memory cell. There are several ways to increase the capacitance such as increasing the surface area of the capacitor. However, this also increases the size of the memory device. How to increase the capacitance without increasing the size of the memory device is an important issue, especially when the integration level is getting higher and higher.

A conventional deep trench capacitor has been widely used in memory devices as shown in FIG. 1. FIG. 1 is a cross-sectional view of a DRAM cell with a deep trench capacitor.

Referring to FIG. 1, the conventional DRAM cell includes a deep trench capacitor 140 and a transistor 150. The deep trench capacitor 140 is configured inside the substrate 100. The deep trench capacitor 140 includes polysilicon layers 106a, 106b, and 106c in the deep trench 110 as the upper electrode, an buried electrode region 102 as the bottom electrode at the periphery of the deep trench 110, and a capacitor dielectric layer 104 between the upper and bottom electrodes. The deep trench capacitor 140 uses the polysilicon layers 106a, 106b, and 106c as the upper electrode. Further, the buried electrode regions 102 and 112 are implanted inside the substrate 100. To form this structure, the manufacturing process is very complex. Further, the conventional DRAM cell includes the transistor 150. The transistor 150 includes a gate electrode 130 above the substrate 100 and the drain/source regions 132 in the substrate 100 beside the two sides of the gate electrode 130. A collar oxide layer 108 is also disposed between the polysilicon layer 106b and the substrate 100 to isolate the polysilicon layer 106b and the buried electrode region 112. A buried strap 114 is further disposed in the substrate 100 adjacent to the polysilicon layer 106c. Hence, how to simplify the structure and the manufacturing process of the DRAM cell is an important issue. Further, since the deep trench capacitor is deep, a capacitor with a larger cross section is required to facilitate the filling of the polysilicon layers. Ultimately, the size of the conventional deep trench capacitor cannot be reduced with the increase of the integration level.

SUMMARY OF THE INVENTION

An object of the present invention is to provide a DRAM cell and a method for fabricating the same to reduce the size of the DRAM cell.

Another object of the present invention is to provide a DRAM cell and a method for fabricating the same to simplify the manufacturing process and to reduce the costs.

Still another object of the present invention is to provide a DRAM cell and a method for fabricating the same to obtain a higher capacitance coupling rate.

Further still another object of the present invention is to provide a DRAM cell and a method for fabricating the same to be compatible with the logic process and be used in system-on-chip (SOC).

The present invention provides a method for fabricating a trench capacitor. The method includes: forming a trench in a substrate; forming a first capacitor dielectric layer on the surface of the trench; forming a conducting layer inside the trench; forming a second capacitor dielectric layer on the surface of the substrate and on the conducting layer, the substrate encompassing the periphery of the first and second capacitor dielectric layers being a bottom electrode; forming a protruding electrode on the substrate, the protruding electrode being on the substrate around the trench and covering a junction between the trench and the substrate; and electrically connecting the protruding electrode and the conducting layer, the conducting layer and the protruding electrode being an upper electrode.

The present invention provides a method for fabricating a DRAM cell, comprising: forming a trench in a substrate; forming a first capacitor dielectric layer on the surface of the trench; forming a conducting layer inside the trench; forming a second capacitor dielectric layer on the surface of the substrate and on the conducting layer, wherein the substrate encompassing the periphery of the first and second capacitor dielectric layers serves as a bottom electrode; forming a protruding electrode and a gate electrode on the substrate, the protruding electrode being on the substrate around the trench and covering a junction between the trench and the substrate; forming a plurality of drain/source regions inside the substrate, the plurality of drain/source regions being beside two sides of the gate electrode; and electrically connecting the protruding electrode and the conducting layer, the conducting layer and the protruding electrode being an upper electrode.

The present invention provides a trench capacitor, comprising: a substrate having a trench; a conducting layer filling the trench and extending to the substrate around the trench; and a capacitor dielectric layer between the surface of the trench and the conducting layer and between the conducting layer and the substrate, the conducting layer being an upper electrode, while the substrate encompassing the capacitor dielectric layer being a bottom electrode.

The present invention provides a trench capacitor, comprising: a substrate having a trench; a conducting layer filling the trench; a first capacitor dielectric layer between the surface of the trench and the conducting layer; a protruding electrode on the substrate around the trench and covering a junction of the trench and the substrate; a second capacitor dielectric layer between the conducting layer and the substrate, the substrate encompassing the first and second capacitor dielectric layers being a bottom electrode; and a conducting structure electrically connecting the protruding electrode and the conducting layer, wherein the conducting layer, the protruding electrode, and the conducting structure serve as an upper electrode.

The present invention provides a DRAM cell, comprising: a substrate having a trench; a conducting layer filling the trench and extending to the substrate around the trench; a capacitor dielectric layer between the surface of the trench and the conducting layer and between the conducting layer and the substrate, the conducting layer being an upper electrode, while the substrate around the capacitor dielectric layer being a bottom electrode; a gate electrode on the substrate beside the conducting layer; a plurality of drain/source regions in the substrate beside two sides of the gate electrode; and a gate dielectric layer between the gate electrode and the substrate.

The present invention provides a DRAM cell, comprising: a substrate having a trench; a conducting layer filling the trench; a first capacitor dielectric layer between the surface of the trench and the conducting layer; a protruding electrode on the substrate around the trench, wherein the protruding electrode covers a junction of the trench and the substrate; a second capacitor dielectric layer between the conducting layer and the substrate, wherein the substrate around the first and second capacitor dielectric layers serves as a bottom electrode; a gate electrode on the substrate beside the protruding electrode; a plurality of drain/source regions in the substrate beside two sides of the gate electrode; a gate dielectric layer between the gate electrode and the substrate; and a conducting structure electrically connecting the protruding electrode and the conducting layer, wherein the conducting layer, the protruding electrode, and the conducting structure serve as an upper electrode.

The present invention provides a protruding electrode to cover the junction between the trench and the substrate and to serve a portion of the upper electrode. Hence, not only current leakage at the junction between the trench capacitor and the substrate is prevented, a higher capacitance coupling rate is provided. Further, because the present invention is compatible with the current logic process, manufacturing costs can be reduced, and the process can be simplified. Further, the present invention can be applied to the SOC. In addition, in accordance to the present invention, an electrode protruded from the trench, the capacitance is larger than the conventional capacitor.

The above is a brief description of some deficiencies in the prior art and advantages of the present invention. Other features, advantages and embodiments of the invention will be apparent to those skilled in the art from the following description, accompanying drawings and appended claims.

DESCRIPTION OF THE PREFERRED EMBODIMENTS

Figure 1:
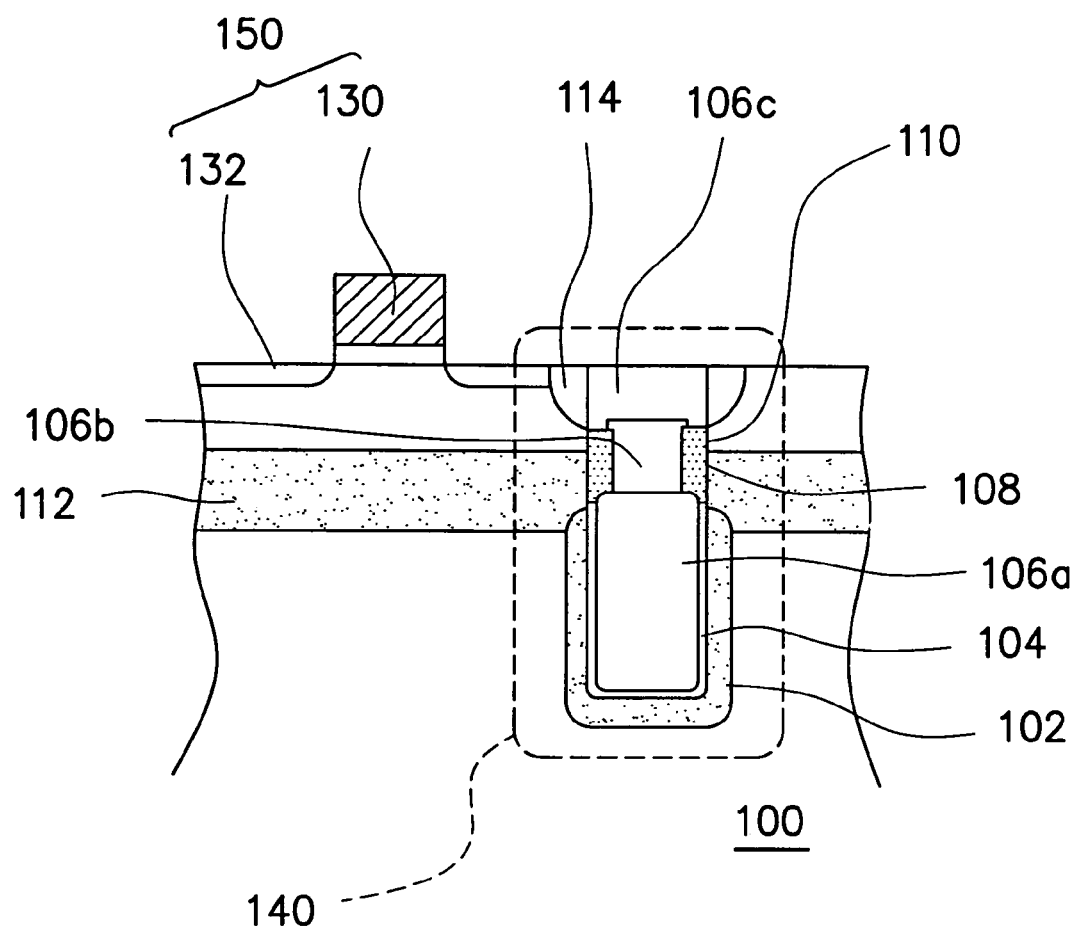
FIG. 1 is a cross-sectional view of a DRAM cell with a deep trench capacitor.
Figure 2A:
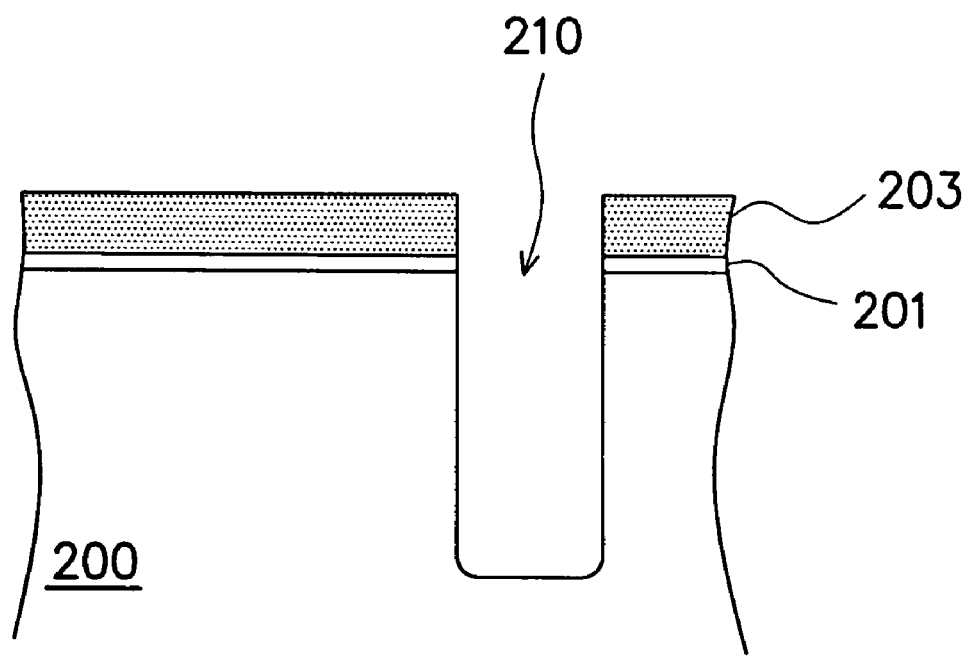
FIGS. 2A-2H are the cross-sectional views showing the steps of the fabrication process for a DRAM cell in accordance with a preferred embodiment of the present invention.

FIGS. 2A-2H are the cross-sectional views showing the steps of the fabrication process for a DRAM cell in accordance with a preferred embodiment of the present invention. The present invention can be applied to system-on-chip. Referring to FIG. 2A, a substrate 200 such as a silicon substrate is provided. A pad oxide layer 201 is formed on the substrate 200. Then, a mask layer 203 is formed on the pad oxide layer 201. Using the mask layer 230 as a mask, a trench 210 is formed by etching the substrate 200.

Figure 2B:
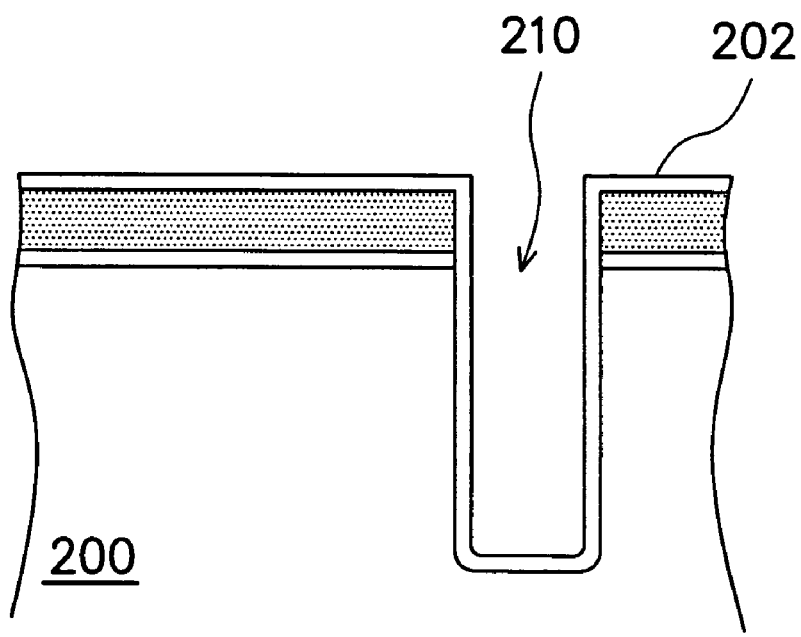

Referring to FIG. 2B, a capacitor dielectric layer 202 is formed on the substrate to cover the surface of the trench 210. The capacitor dielectric layer 202 can be a SiO2/Si3N4/SiO2 (ONO) stacked layer, or a Si3N4/SiO2 (NO) stacked layer.

Figure 2C:
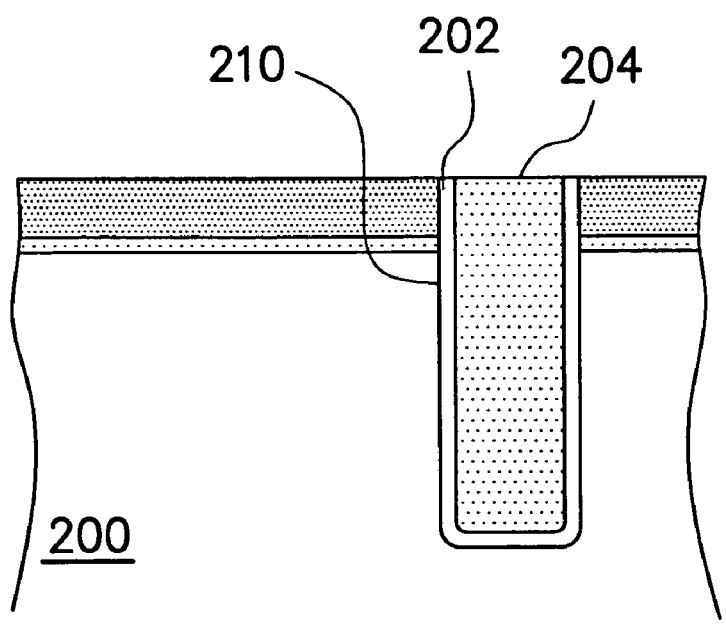

Referring to FIG. 2C, a first conducting layer 204 is formed in the trench 210. The material of the first conducting layer 204 is, for example, doped polysilicon. To form the first conducting layer 204 includes filling the trench 210 with a conducting layer, followed by removing the conducting layer and the capacitor dielectric layer 202 outside the trench 210 by chemical mechanical polishing (CMP) process. The patterned mask layer 203 can be used as an etching stop layer.

Figure 2D:
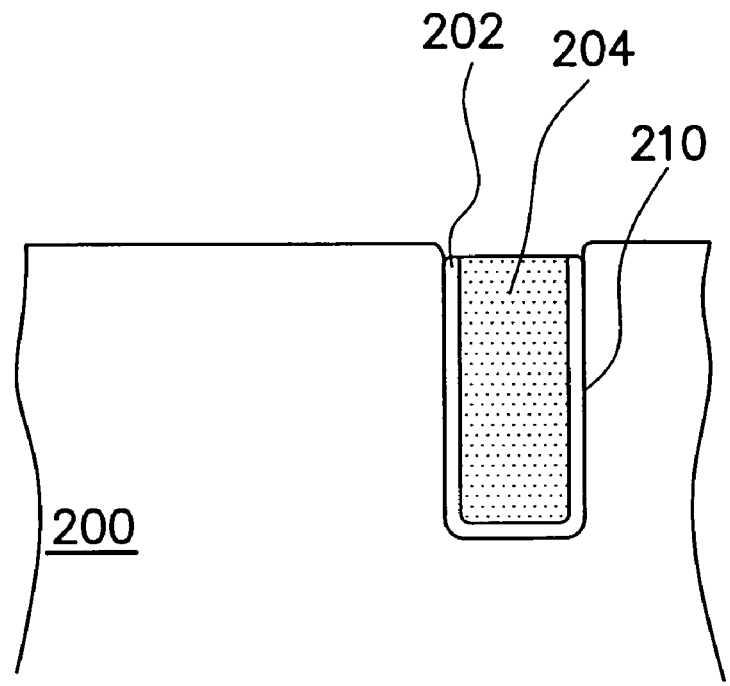
Figure 2E:
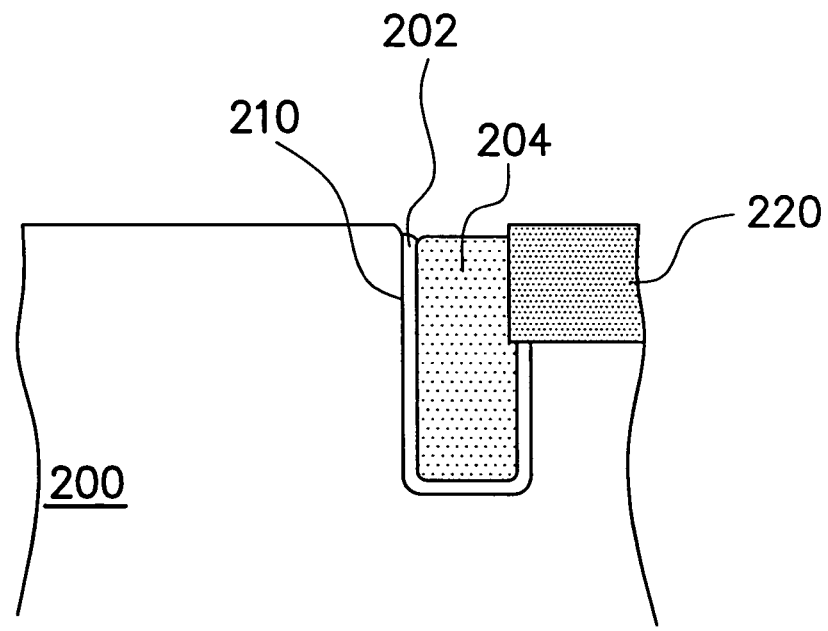

Referring to FIG. 2D, a portion of the first conducting layer 204 is removed by etching back such that its top aligns with the surface of the substrate 200. The pad oxide layer 201 and the patterned mask layer 203 are then removed. At the same time, a portion of the capacitor dielectric layer 202 is also removed.

Figure 2F:
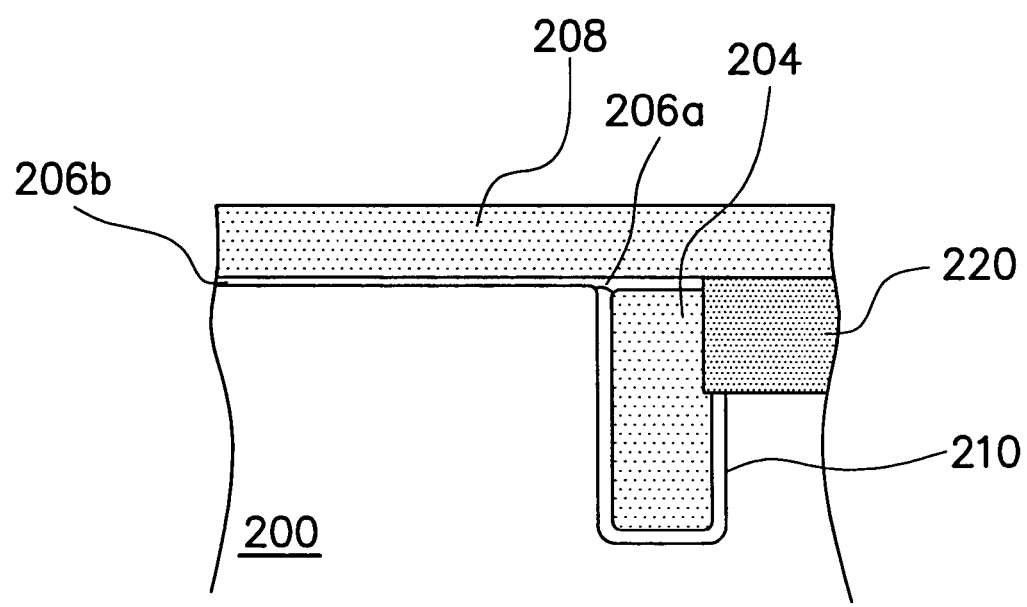

Referring to FIG. 2F, a dielectric layer is formed on the surface of the substrate 200 and the first conducting layer 204. The dielectric layer on the substrate 200 around the trench 210 can serve as another capacitor dielectric layer 206a. The dielectric layer farther away from the trench 210 can be the gate dielectric layer 206b. The material of the capacitor dielectric layer 206a and the gate dielectric layer 206b can be the same or different. If they are different, the capacitor dielectric layer 206a and the gate dielectric layer 206b can be formed respectively. The capacitor dielectric layer 206a and the gate dielectric layer 206b can be a SiO2/Si3N4/SiO2 (ONO) stacked layer or a Si3N4/SiO2 (NO) stacked layer. Further, the gate dielectric layer 206b can be an oxide layer. In addition, before forming the gate dielectric layer 206b, a well implantation process can be performed to form a well in the substrate (not shown). Taking PMOS as an example, the well formed in the substrate can be an N well. Then, a second conducting layer 208, such as, doped polysilicon is formed in the substrate 200.

Figure 2G:
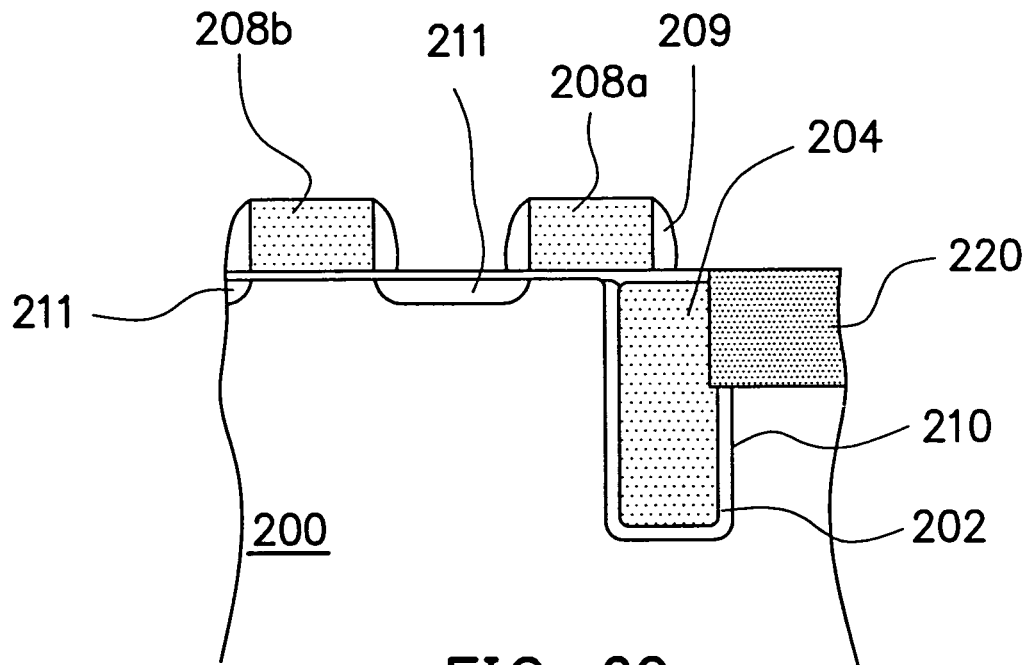

Referring to FIG. 2G, the second conducting layer 208 is defined to form a protruding electrode 208a and a gate electrode 208b. The protruding electrode 208a is located on the substrate 200 around the trench 210 and covers the junction between the trench 210 and the substrate 200. Hence, the capacitor dielectric layer 202 is prevented from being damaged due to subsequent processes, and ultimately, a leakage from the junction between the top of the trench 210 and the surface of the substrate 200 can be avoided. Further, the protruding electrode 208a can increase the capacitance coupling rate. The gate electrode 208b is located on the substrate 200 beside the protruding electrode 208a. Then, the spacers 209, such as silicon nitride spacers, can be formed on the sidewalls of the gate electrode 208b and the protruding electrode 208a. Thereafter, a drain/source implantation process is performed to form the drain/source regions 211 beside the sides of the gate electrode. Taking a PMOS as an example, the drain/source regions 211 are P-type regions. Then, a salicide process can be performed to form a self-aligned silicide layer (not shown) on the exposed surfaces of the gate electrode 208b and the protruding electrode 208a.

Figure 2H:
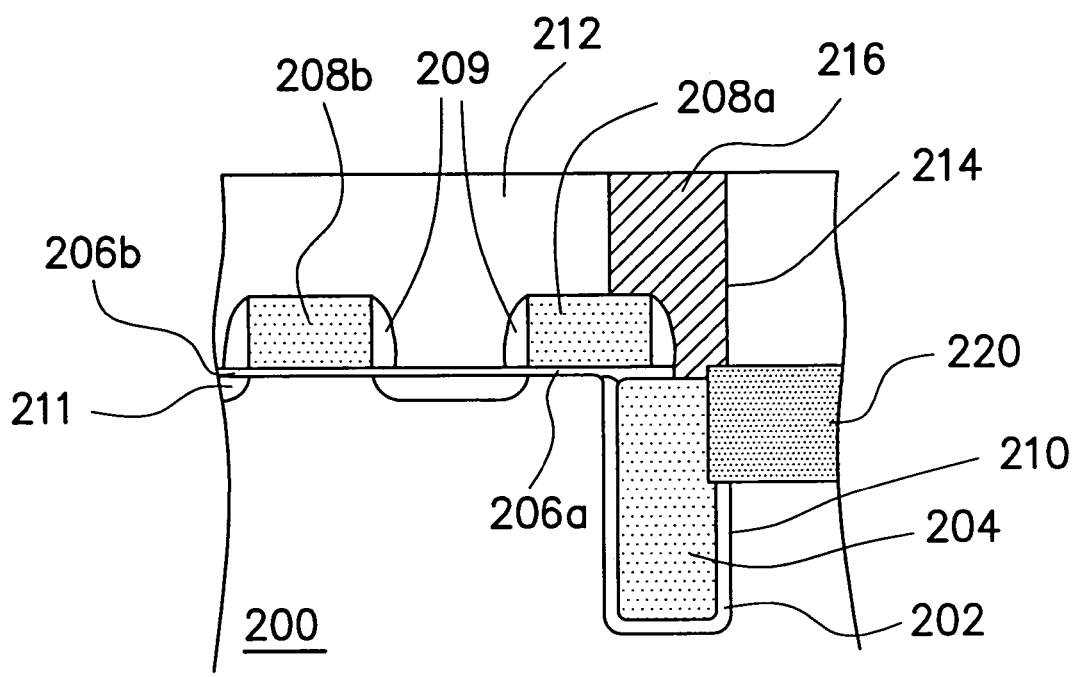

Referring to FIG. 2H, the protruding electrode 208a is electrically connected to the first conducting layer 204. To achieve that, an ILD layer 212 is formed on the substrate 200 to cover the protruding electrode 208a, the gate electrode 208b, the shallow trench isolation structure 220, and the first conducting layer 204. Thereafter, a contact window opening 214 is formed in the ILD layer 212 to expose a portion of the protruding electrode 208a and the first conducting layer 204. A conducting structure 216, such as, Cu or W, is formed in the contact window opening 214. After completing the steps of forming a DRAM cell, a negative voltage is applied to the protruding electrode 208a so that the substrate 200 around the capacitor dielectric layers 202 and 206a will be reversed to have the same polarity as the drain/source regions 211. Hence, the substrate 200 around the capacitor dielectric layers 202 and 206a is deemed to be the bottom electrode of the capacitor. Correspondingly, the capacitor dielectric layers 202 and 206a are the dielectric layers of the capacitor, whereas the conducting structure 216, the first conducting layer 204, and the protruding electrode 208a are the upper electrode of the capacitor. Further, the contact window opening 214 and the conducting structure 216 can be concurrently formed with the bit line of the DRAM so that no additional photolithography process is required.

In brief, the present invention provides a protruding electrode to cover the junction of the trench and the substrate and to serve as a portion of the upper electrode. Hence, leakage at the junction between the trench capacitor and the substrate can be prevented, and a higher capacitance coupling rate can be provided. Further, because the present invention is compatible with the current logic process, the manufacturing costs can be reduced and the process is simplified. Further, the present invention can be applied to the SOC. Since the capacitor of the present invention has a simpler structure than the conventional deep trench capacitor, the costs can be effectively reduced. In addition, in accordance of the present invention, an electrode is protruded from the trench, the capacitance is larger than the conventional capacitor. Hence, the capacitor of the present invention can provide the required capacitance and is suitable for the fabrication of a smaller device while maintaining the requisite capacitance.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A trench capacitor, comprising:
 a substrate having a trench;
 a conducting layer filling said trench;
 a first capacitor dielectric layer between a surface of said trench and said conducting layer, wherein the first capacitor dielectric layer continuously extends from inside of the trench to an upper surface of the substrate and is formed with an oxide/nitride stacked layer;
 a protruding electrode on said substrate around said trench and covering a junction of said trench and said substrate, said protruding electrode having an upper surface and a sidewall;
 a second capacitor dielectric layer between said protruding electrode and said substrate, said substrate around said first and second capacitor dielectric layers being a bottom electrode; and
 a conducting structure electrically connecting said protruding electrode and said conducting layer, wherein said conducting layer, said protruding electrode, and said conducting structure serve as an upper electrode, and wherein said conducting structure electrically connects said protruding electrode by contacting solely the upper surface of said protruding electrode.

2. The trench capacitor of claim 1, wherein said protruding electrode extends to cover said conducting layer.

3. The trench capacitor of claim 1, wherein said first and second capacitor dielectric layers are at least a SiO2/Si3N4/SiO2 (ONO) stacked layer or a Si3N4/SiO2 (NO) stacked layer.

4. The trench capacitor of claim 1, wherein said conducting layer and said protruding electrode include doped polysilicon.

5. The trench capacitor of claim 1, wherein said conducting structure is copper (Cu) or tungsten (W).

6. The trench capacitor of claim 1, wherein said conducting structure is separated from the sidewall of said protruding electrode by an insulating spacer.

7. A dynamic random access memory cell, comprising:
 a substrate having a trench;
 a conducting layer filling said trench;
 a first capacitor dielectric layer between the surface of said trench and said conducting layer, wherein the first capacitor dielectric layer continuously extends from inside of the trench to an upper surface of the substrate and is formed with an oxide/nitride stacked layer;
 a protruding electrode on said substrate around said trench and covering a junction of said trench and said substrate, said protruding electrode having an upper surface and a sidewall;
 a second capacitor dielectric layer between said protruding electrode and said substrate, said substrate around said first and second capacitor dielectric layers being a bottom electrode;
 a gate electrode on said substrate beside said protruding electrode;
 a plurality of drain/source regions in said substrate beside two sides of said gate electrode;
 a gate dielectric layer between said gate electrode and said substrate; and
 a conducting structure electrically connecting said protruding electrode and said conducting layer, and said conducting layer, said protruding electrode, and said conducting structure being an upper electrode, wherein said conducting structure electrically connects said protruding electrode by contacting solely the upper surface of said protruding electrode.

8. The dynamic random access memory cell of claim 7, wherein said protruding electrode extends to cover said conducting layer.

9. The dynamic random access memory cell of claim 7, wherein said first and second capacitor dielectric layers is at least a SiO2/Si3N4/SiO2 (ONO) stacked layer or a Si3N4/SiO2 (NO) stacked layer.

10. The dynamic random access memory cell of claim 7, wherein said conducting layer and said protruding electrode include doped polysilicon.

11. The dynamic random access memory cell of claim 7, wherein said conducting structure is copper (Cu)-or tungsten (W).

12. The dynamic random access memory cell of claim 7 further comprising a plurality of spacers on sidewalls of said conducting layer and said gate electrode.

13. The dynamic random access memory cell of claim 12 further comprising a self-aligned silicide layer on surfaces of said conducting layer and said gate electrode.

14. The dynamic random access memory cell of claim 7, wherein a material of said first and second capacitor dielectric layers is the same as a material of said gate dielectric layer.

15. The dynamic random access memory cell of claim 7, wherein a material of said first and second capacitor dielectric layers is different from a material of said gate dielectric layer.

16. The dynamic random access memory cell of claim 7, wherein said conducting structure is separated from the sidewall of said protruding electrode by an insulating spacer.

17. A dynamic random access memory cell comprising:
a substrate having a trench;
a conducting layer filling said trench and extending to said substrate around said trench, wherein a top surface of the conducting layer is aligned with an upper surface of the substrate;
a capacitor dielectric layer continuously extending from inside the trench to the upper surface of the substrate between a surface of said trench and said conducting layer, and between said conducting layer and said substrate, said conducting layer being an upper electrode, and said substrate around said capacitor dielectric layer being a bottom electrode, and said capacitor dielectric is formed with an oxide/nitride stacked layer;
a gate electrode on said substrate beside said conducting layer;
a plurality of drain/source regions in said substrate beside two sides of said gate electrode; and
a gate dielectric layer between said gate electrode and said substrate.

18. The dynamic random access memory cell of claim 17, wherein said first and second capacitor dielectric layers is at least a SiO2/Si3N4/SiO2 (ONO) stacked layer or a Si3N4/SiO2 (NO) stacked layer.

19. The dynamic random access memory cell of claim 17, wherein a material of said capacitor dielectric is the same as a material of said gate dielectric layer.

20. The dynamic random access memory cell of claim 17, wherein a material of said capacitor dielectric is different from a material of said gate dielectric layer.

21. The dynamic random access memory cell of claim 17, wherein said conducting layer and said gate electrode include doped polysilicon.

22. The dynamic random access memory cell of claim 17 further comprising a plurality of spacers on sidewalls of said conducting layer and said gate electrode.

23. The dynamic random access memory cell of claim 17 further comprising a self-aligned silicide layer on surfaces of said conducting layer and said gate electrode.

* * * * *